(12) United States Patent
Hu

(10) Patent No.: US 11,355,522 B2
(45) Date of Patent: Jun. 7, 2022

(54) DISPLAY PANEL AND TERMINAL DEVICE FOR APPLICATION

(71) Applicant: WUHAN CHINA STAR OPTOELECTRONICS SEMICONDUCTOR DISPLAY TECHNOLOGY CO., LTD., Wuhan (CN)

(72) Inventor: Junyan Hu, Wuhan (CN)

( * ) Notice: Subject to any disclaimer, the term of this patent is extended or adjusted under 35 U.S.C. 154(b) by 190 days.

(21) Appl. No.: 16/765,882

(22) PCT Filed: Dec. 25, 2019

(86) PCT No.: PCT/CN2019/128297
§ 371 (c)(1),
(2) Date: May 21, 2020

(87) PCT Pub. No.: WO2021/077606
PCT Pub. Date: Apr. 29, 2021

(65) Prior Publication Data
US 2021/0408055 A1 Dec. 30, 2021

(30) Foreign Application Priority Data
Oct. 25, 2019 (CN) .......................... 201911022303.2

(51) Int. Cl.
*H04N 5/225* (2006.01)
*H01L 27/12* (2006.01)

(52) U.S. Cl.
CPC .......... *H01L 27/124* (2013.01); *H04N 5/2257* (2013.01)

(58) Field of Classification Search
CPC . H01L 27/124; H01L 27/1248; H04N 5/2257; G09F 9/00
See application file for complete search history.

(56) References Cited

U.S. PATENT DOCUMENTS

| | | | |
|---|---|---|---|
| 2019/0214601 A1* | 7/2019 | Park | H01L 27/3272 |
| 2019/0252475 A1* | 8/2019 | Sung | H01L 27/3246 |
| 2019/0384121 A1* | 12/2019 | Nishiwaki | G02F 1/133512 |
| 2020/0176519 A1* | 6/2020 | Seo | H01L 51/56 |
| 2020/0321561 A1* | 10/2020 | Park | H01L 51/5281 |
| 2020/0357871 A1* | 11/2020 | Chung | H01L 27/3227 |

* cited by examiner

*Primary Examiner* — Sinh Tran
*Assistant Examiner* — Zhenzhen Wu

(57) ABSTRACT

A display panel and a terminal device thereof are provided. The display panel defines a display region and a camera region, and includes substrate layers and a device function layer disposed on the substrate layers. The substrate layers include a first substrate, a first buffer layer, a second substrate and a second buffer layer, which are sequentially stacked. The device function layer is disposed on the second buffer layer. The first buffer layer is provided with a first through hole in the camera region, and the second substrate downwardly fills the first through hole and further contacts the first substrate.

8 Claims, 2 Drawing Sheets

DISPLAY PANEL AND TERMINAL DEVICE FOR APPLICATION

CROSS REFERENCE TO RELATED APPLICATIONS

This application claims the benefit of priority to a China Patent Application No. 201911022303.2 filed on Oct. 25, 2019 with China Intellectual Property Administration, and entitled "DISPLAY PANEL AND TERMINAL DEVICE THEREOF", the entire contents of which are incorporated herein by reference.

FIELD OF INVENTION

The present disclosure relates to the technical field of flat display, and in particular to a display panel and a terminal device thereof.

BACKGROUND OF DISCLOSURE

It is known that the full screen technology is one of the important display technologies on which the display industry has focused in the past two years. The advantages of the full screen are not only achieving a higher screen-body ratio but also meeting installation requirements of more application software as the display area increases.

In order to increase the screen-body ratio, notch hole screens and water drop notch screens have been introduced to place cameras, sensors, infrared lenses and other functional modules. Recently, the technology of punching a round hole in the display screen has also been developed. The punched round hole can be used to place the camera inside the screen, and the screen-body ratio can reach 96%. But for now, the "full screens" on the market are still "pseudo" full screens. That is, the screens only have high screen-body ratios, but still cannot achieve screen display above the camera. Although the ratio can be further increased, there are still regional display defects, and the screen is not a true full screen display, so it is not a "full screen" in the true sense of the word.

However, the full-screen technologies mentioned above still need to excavate or profile a part of the display screen to expose the location of the camera, so that outside light can enter the camera, thereby reducing the influence of the layers above the camera on the light transmittance. Nevertheless, many difficulties have to be overcome at present.

In this regard, in the industry, some solutions are proposed to improve the transmittance, such as opening a hole in a polarizer, partially thinning a polyimide substrate or using transparent materials instead, specially designing arrangement or density of pixels above the camera, and so on, but these designs have encountered some difficulties in practical applications, so that the final result is not ideal.

Therefore, it is necessary to develop a new type of display panel to overcome the defects in the prior art.

SUMMARY OF INVENTION

Technical Problem

One aspect of the present disclosure is to provide a display panel adopting a novel structure design of a functional layer in a camera region, which can improve a transmittance of the camera region under a screen for incident light.

Technical Solutions

A display panel defining a display region (AA region) and a camera region (Camera) includes substrate layers and a device function layer disposed on the substrate layers, wherein the substrate layers include a first substrate, a first buffer layer (Buffer 1), a second substrate, and a second buffer layer (Buffer 2), which are sequentially stacked, wherein the device functional layer is disposed on the second buffer layer. The first buffer layer in the camera region is provided with a first through hole reaching an upper surface of the first substrate, and the second substrate downwardly fills the first through hole and further contacts the first substrate.

Furthermore, in different embodiments, the substrate layers are preferably polyimide (PI) layers. Specifically, the first substrate is a first PI layer (PI1), and the second substrate is a second PI layer (PI2), but are not limited thereto.

Furthermore, in different embodiments, the second substrate in the camera region is downwardly provided with a first cavity, and a first filling layer (ODH) is disposed in the first cavity.

Furthermore, in different embodiments, a thickness of the first filling layer in the second substrate ranges from 1 to 10 um.

Furthermore, in different embodiments, a transmittance of organic photoresist material employed in the first filling layer is >80%.

Furthermore, in different embodiments, the device functional layer includes insulating layers and conductive layers disposed at intervals in the insulating layers, wherein the insulating layers include a first gate insulating layer (GI1), a second gate insulating layer (GI2), and a dielectric layer (ILD), and the conductive layers includes an active layer (Active), a first gate layer (GE1), a second gate layer (GE2), and a first metal layer (SD1); wherein the first metal layer is located on the dielectric layer, and a first planarization layer is disposed on the dielectric layer for planarization.

Furthermore, in different embodiments, the insulating layers in the camera region are provided with a second through hole reaching the second substrate, wherein the first planarization layer downwardly fills the second through hole and further contacts an upper surface of the first filling layer disposed in the second substrate.

Furthermore, in different embodiments, the second through hole is provided with an edge step at the insulating layers, so that the first planarization layer filling the second through hole forms a corresponding edge step. Because the insulating layers are a multi-layer stacked structure, the edge step formed by the filling layers may be multiple steps corresponding to different layers, but the edge step may also be a single step, which may be determined as needed, and is not limited thereto.

Furthermore, in different embodiments, a second metal layer is disposed on the first planarization layer, a second planarization layer is disposed on the second metal layer, an anode is disposed on the second planarization layer, and a pixel defining layer is disposed on the anode.

Furthermore, in different embodiments, the anode in the camera region is electrically connected to the second metal layer in the camera region through a via, and the second metal layer extends from the camera region to the display region and is electrically connected to the first metal layer in the display region through a via.

Furthermore, in different embodiments, the display panel in the present disclosure further defines a pad region, wherein the insulating layers in the pad region are provided with a third through hole reaching an upper surface of the second substrate, the third through hole is filled with a second filling layer, which respectively upwardly connected to the first planarization layer and downwardly connected to the second substrate.

Furthermore, in different embodiments, the third through hole is provided with an edge step at the insulating layers, so that the second filing layer disposed in the third through hole forms a corresponding edge step. Because the insulating layers are a multi-layer stacked structure, the edge step formed by the second filling layers may be multiple steps corresponding to different layers, but the edge step may also be a single step, which may be determined as needed, and is not limited thereto.

Furthermore, in different embodiments, a terminal device is provided and includes the display panel in the present disclosure.

Beneficial Effect:

The present disclosure relates to a display panel. A functional layer in a camera region adopts a new structural design, which can improve a transmittance of a camera region under a screen for incident light.

Specifically, firstly, the hole is opened in the first buffer layer (buffer 1) between the two substrate layers (for example, PI, but not limited thereto) in the camera region by etching, and the second substrate (PI2) is used for filling the hole. When the hole is opened in the insulating layers in the pad region (Pad), the hole is also simultaneously opened in the insulating layers in the camera region (camera). Through a process adjustment, the second buffer layer is etched and penetrated into the second substrate (PI2), thereby reducing a thickness of the second substrate in the camera region.

Furthermore, while the pad region (Pad) is filled with an organic photoresist to form the second filling layer (ODH), the cavity etched into the upper surface of the second substrate in the camera region is also filled with the first filling layer, thereby filling the substrate layers with organic photoresist material with a high transmittance. Finally, the second through hole of the insulating layers in the camera region is filled during a manufacturing process for the first planarization layer (PLN1). The thin film transistor (TFT) in the display region (AA region) is connected to the anode in the camera region via the second metal layer (SD2) to control the pixels. Transparent traces may be employed as the second metal layer.

As described above, after the manufacturing process is complete, the structure configuration of each functional layer of the camera region can improve the transmittance of the camera region in various aspects, which specifically are as follows:

1. The multiple inorganic layers (that is, the insulating layers) in this region are all etched and filled with the first planarization layer, thereby reducing the refractive effect of the inorganic layers on light.

2. The second PI layer is replaced by organic photoresist material with a high transmittance, thereby reducing the influence of the PI material on the transmittance.

3. There are only two metal layers, namely the second metal layer and the anode, in this region, and other metal traces are in the display region, thereby reducing reflection and diffraction effects of the metal traces on incident light.

BRIEF DESCRIPTION OF DRAWINGS

In order to explain the technical solutions in the embodiments of the present disclosure clearly, the drawings used in the description of the embodiments are briefly introduced below. Obviously, the drawings in the following description are only some embodiments of the present disclosure. For those skilled in the art, other drawings can be obtained based on these drawings without making inventive efforts.

DETAILED DESCRIPTION OF PREFERRED EMBODIMENTS

The technical solutions of a display panel and a terminal device thereof in accordance with the present disclosure is described in further detail below with reference to the drawings and embodiments.

Figure 1:
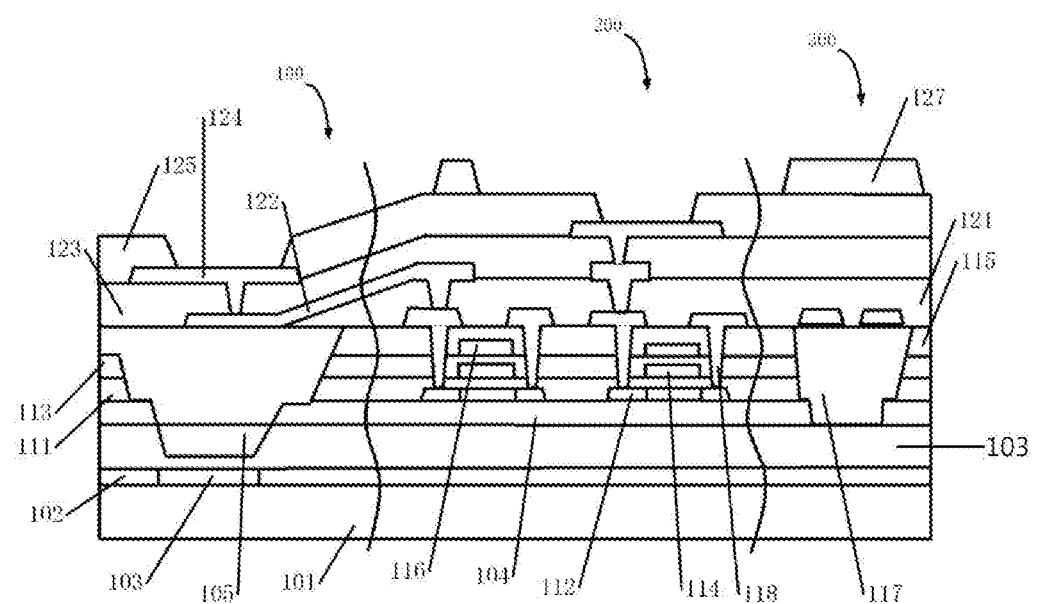
FIG. 1 is a schematic structural diagram of a display panel provided in an embodiment of the present disclosure.

Referring to FIG. 1, an embodiment of the present disclosure provides a display panel defining a camera region (Camera) 100, a display region (AA region) 200, and a pad region (Pad) 300, and including substrate layers and a device function layer disposed on the substrate layers.

The substrate layers include a first polyimide (PI) layer 101, a first buffer layer (Buffer1) 102, a second PI layer 103, and a second buffer layer (Buffer2) 104. The device function layer includes insulating layers and conductive layers disposed at intervals in the insulating layers.

In this embodiment, the device function layer is a thin film transistor (TFT) device layer, and the insulating layers include a first gate insulating layer (GI1) 111, a second gate insulating layer (GI2) 113, and a dielectric layer (ILD) 115. The conductive layers include an active layer (Act) 112, a first gate layer (GE1) 114, a second gate layer (GE2) 116, and a first metal layer (SD1) 118 configured to be a source and a drain.

Furthermore, the dielectric layer (ILD) 115 in the device function layer is further provided with a first planarization layer (PLN1) 121 for planarizing the first metal layer 118, a second metal layer (SD2) 122, a second planarization layer (PLN2) 123, anode (ANO) 124, a pixel defining layer (PDL) 125, and a support column (or photo spacer, PS) 127.

Furthermore, the first buffer layer 102 in the camera region is provided with a first through hole reaching an upper surface of the first PI layer 101, and the second PI layer 103 downwardly fills the first through hole and further contacts the first PI layer 101. The hole is opened in the first buffer layer (buffer 1) between the two PI layers in the camera region by etching, and then the second PI layer (PI2) is used for filling the hole. Afterwards, when a hole is opened again in the insulating layers in the camera region (camera), through a process adjustment, the second buffer layer 104 in this region is etched and penetrated into the second PI layer (PI2), thereby reducing an overall thickness of the second PI layer in the camera region.

Specifically, the second PI layer 103 in the camera region is downwardly provided with a first cavity, and the first cavity is filled with a first filling layer (ODH) 105. A thickness of the first filling layer 105 in the second PI layer 103 ranges from 1 to 10 um, which does not penetrate through the second PI layer 103. Furthermore, the first filling layer 105 is made of organic photoresist material, and its transmittance is >80%. By using the organic photoresist material with the high transmittance instead of the PI material in the corresponding region, the transmittance of the region can be further improved.

Furthermore, the insulating layers in the camera region are provided with a second through hole, which penetrates through the dielectric layer 115, the second gate insulating layer 113, and the first gate insulating layer 111, which are included in the insulating layers, and further penetrates through the second buffer layer 104 to an upper surface of the second PI layer 103. The first planarization layer 121 downwardly fills the second through hole and then contacts the second PI layer. The second through hole directly correspond to the first cavity, so that the first planarization layer 121 downwardly filling the second through hole contacts the first filling layer 105. The multiple inorganic layers (i.e., the insulating layers) in the camera region 100 are completely etched and filled with the first planarization layer 121, thereby reducing the refraction effect of the original inorganic layers on incident light.

Furthermore, since the second through hole penetrates through a plurality of stacked structures, a step portion is formed at edges of the different layers through which are penetrated by the second through hole, so that the first planarization layer filling the second through hole forms a corresponding edge step. The number of the steps of the step portion may be a number corresponding to the stacked layers, or may be a single step, which may be determined as needed, and is not limited thereto.

The anode 124 in the camera region 100 is electrically connected to the second metal layer 122 in the camera region through a via, and the second metal layer 122 extends from the camera region 100 to the display region 200 and is electrically connected to the first metal layer 118 in the display region 200 through a via. That is, the thin film transistor (TFT) in the display region (AA region) 200 is connected to the anode 124 in the camera region 100 via the second metal layer (SD2) to control the pixels. Transparent traces may be employed as the second metal layer. In this configuration, there are only two metal layers, namely the second metal layer and the anode, in the camera region 100, and other metal traces are in the display region 200, thereby reducing reflection and diffraction effects of the metal traces on incident light.

Furthermore, the insulating layers in the pad region 300 are provided with a third through hole reaching an upper surface of the second IP layer 103, and the third through hole is filled with a second filling layer (ODH) 127, which respectively upwardly connected to a bottom surface of the first planarization layer 121 and downwardly connected to an upper surface of the second PI layer 103.

As described above, after the manufacturing process is complete, the structure configuration of each functional layer of the camera region can improve the transmittance of the camera region in various aspects, which specifically are as follows:

1. The multiple inorganic layers (that is, the insulating layers) in this region are all etched and filled with the first planarization layer, thereby reducing the refractive effect of the inorganic layers on light.

2. The second PI layer is replaced by organic photoresist material with a high transmittance, thereby reducing the influence of the PI material on the transmittance.

3. There are only two metal layers, namely the second metal layer and the anode, in this region, and other metal traces are in the display region, thereby reducing reflection and diffraction effects of the metal traces on incident light.

Figure 2:
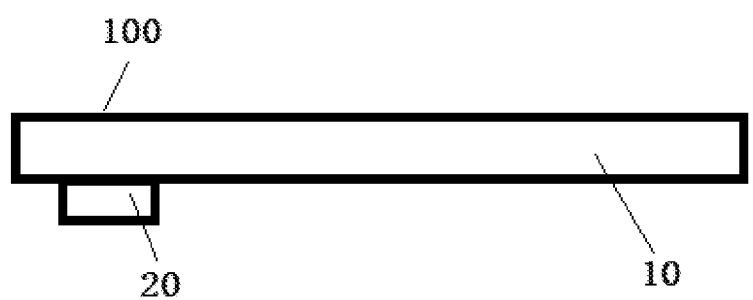
FIG. 2 is a schematic structural diagram of a terminal device in accordance with another embodiment of the present disclosure.

Furthermore, another embodiment of the present disclosure provides a terminal device, as shown in FIG. 2, including the display panel 10 and a camera 20 in accordance with the present disclosure, wherein the camera 20 is disposed to correspond to the camera region 100 of the display panel 10. Since the functional layer of the camera region 100 of the display panel 10 in accordance with the present disclosure adopts a new structure configuration, thereby effectively improving the transmittance of the camera region for incident light, and thereby providing its terminal device with a novel and effective under-screen camera solution.

Furthermore, the terminal device may be any device having a camera function, including, but not limited to, a mobile phone, a smart tablet, a computer, and the like.

The technical scope of the present disclosure is not limited to the content in the above description. Those skilled in the art can make various alterations and modifications to the above embodiments without departing from the technical concept of the present disclosure, and these alterations and modifications should all within the scope of the disclosure.

What is claimed is:

1. A display panel defining a display region and a camera region, comprising:
   substrate layers and a device functional layer disposed on the substrate layers, wherein the substrate layers include a first substrate, a first buffer layer, a second substrate, and a second buffer layer, which are sequentially stacked, wherein the device functional layer is disposed on the second buffer layer;
   the first buffer layer in the camera region is provided with a first through hole reaching an upper surface of the first substrate, and the second substrate downwardly fills the first through hole and further contacts the first substrate;
   wherein the second substrate in the camera region is downwardly provided with a first cavity, and a first filling layer is disposed in the first cavity; and
   wherein the device functional layer includes insulating layers and conductive layers disposed at intervals in the insulating layers, wherein the insulating layers include a first gate insulating layer, a second gate insulating layer, and a dielectric layer, and the conductive layers includes an active layer, a first gate layer, a second gate layer, and a first metal layer; wherein the first metal layer is located on the dielectric layer, and a first planarization layer is disposed on the dielectric layer for planarization.

2. The display panel as claimed in claim 1, wherein a thickness of the first filling layer in the second substrate ranges from 1 to 10 um.

3. The display panel as claimed in claim 1, wherein a transmittance of organic photoresist material employed in the first filling layer is >80%.

4. The display panel as claimed in claim 1, wherein the insulating layers in the camera region are provided with a second through hole reaching the second substrate, wherein the first planarization layer downwardly fills the second through hole and further contacts an upper surface of the first filling layer disposed in the second substrate.

5. The display panel as claimed in claim 1, wherein a second metal layer is disposed on the first planarization layer, a second planarization layer is disposed on the second metal layer, an anode is disposed on the second planarization layer, and a pixel defining layer is disposed on the anode.

6. The display panel as claimed in claim 5, wherein the anode in the camera region is electrically connected to the second metal layer in the camera region through a first via, and the second metal layer extends from the camera region to the display region and is electrically connected to the first metal layer in the display region through a second via.

7. The display panel as claimed in claim 1 further defining a pad region, wherein the insulating layers in the pad region are provided with a third through hole reaching an upper surface of the second substrate, the third through hole is filled with a second filling layer, which respectively upwardly connected to the first planarization layer and downwardly connected to the second substrate.

8. A terminal device comprising:
a display panel and a camera disposed under the display panel; wherein the display panel is as claimed in claim 1, and the camera is correspondingly disposed under the camera region.

* * * * *